United States Patent
Chandra et al.

(10) Patent No.: US 11,882,655 B2
(45) Date of Patent: Jan. 23, 2024

(54) SURFACE MOUNT PADS FOR NEXT GENERATION SPEEDS

(71) Applicant: DELL PRODUCTS L.P., Round Rock, TX (US)

(72) Inventors: Umesh Chandra, Santa Cruz, CA (US); Douglas Wallace, Round Rock, TX (US); Bhyrav Mutnury, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 262 days.

(21) Appl. No.: 16/888,644

(22) Filed: May 29, 2020

(65) Prior Publication Data

US 2021/0378094 A1 Dec. 2, 2021

(51) Int. Cl.
*H05K 1/02* (2006.01)
*H05K 1/11* (2006.01)

(52) U.S. Cl.
CPC ............. *H05K 1/111* (2013.01); *H05K 1/025* (2013.01); *H05K 1/0215* (2013.01); *H05K 2201/10318* (2013.01); *H05K 2201/10636* (2013.01)

(58) Field of Classification Search
CPC ............. H05K 1/111; H05K 1/0215; H05K 2201/10318; H05K 2201/10636; H05K 1/025; H05K 2201/09709; H05K 3/4015; H01R 12/57
See application file for complete search history.

(56) References Cited

U.S. PATENT DOCUMENTS

| | | | | |
|---|---|---|---|---|
| 5,473,281 A | * | 12/1995 | Honjo ....................... | H03F 3/60 333/33 |
| 8,274,307 B1 | * | 9/2012 | Ben Artsi ............... | H01P 5/028 333/34 |
| 10,791,629 B1 | * | 9/2020 | Ren ......................... | H05K 3/303 |
| 2004/0012458 A1 | * | 1/2004 | Amparan .................. | H01P 5/02 333/34 |
| 2007/0268088 A1 | * | 11/2007 | Singh ....................... | H03H 7/38 333/33 |
| 2010/0103636 A1 | * | 4/2010 | Ootsuka ................. | H05K 1/025 361/767 |
| 2010/0231320 A1 | * | 9/2010 | Kawamura ............... | H01P 5/08 257/E21.511 |
| 2015/0313005 A1 | * | 10/2015 | Takabatake .......... | H05K 1/0213 174/261 |
| 2018/0098415 A1 | * | 4/2018 | Lin ......................... | H05K 3/306 |
| 2018/0261961 A1 | * | 9/2018 | Luk ......................... | H01R 43/16 |
| 2018/0368259 A1 | * | 12/2018 | Kumar ................... | H01R 12/72 |
| 2019/0320529 A1 | * | 10/2019 | Goud ...................... | H05K 1/111 |

* cited by examiner

*Primary Examiner* — Steven T Sawyer
(74) *Attorney, Agent, or Firm* — NORTH WEBER & BAUGH LLP

(57) ABSTRACT

A high-speed transmission circuit comprises, as part of a signal path, a connector pin disposed on a pad that comprises an unused pad region. The unused pad region is not considered part of the signal path but is part of a resonant sub-circuit. In various embodiments, by properly adjusting the dimensions of the pad region and other structures in the high-speed transmission circuit, resonant frequencies of the sub-circuit are shifted to a frequency range that is outside of the frequency range of interest in the signal path, thereby, reducing insertion loss and increasing signal integrity without compromising mechanical stability.

19 Claims, 7 Drawing Sheets

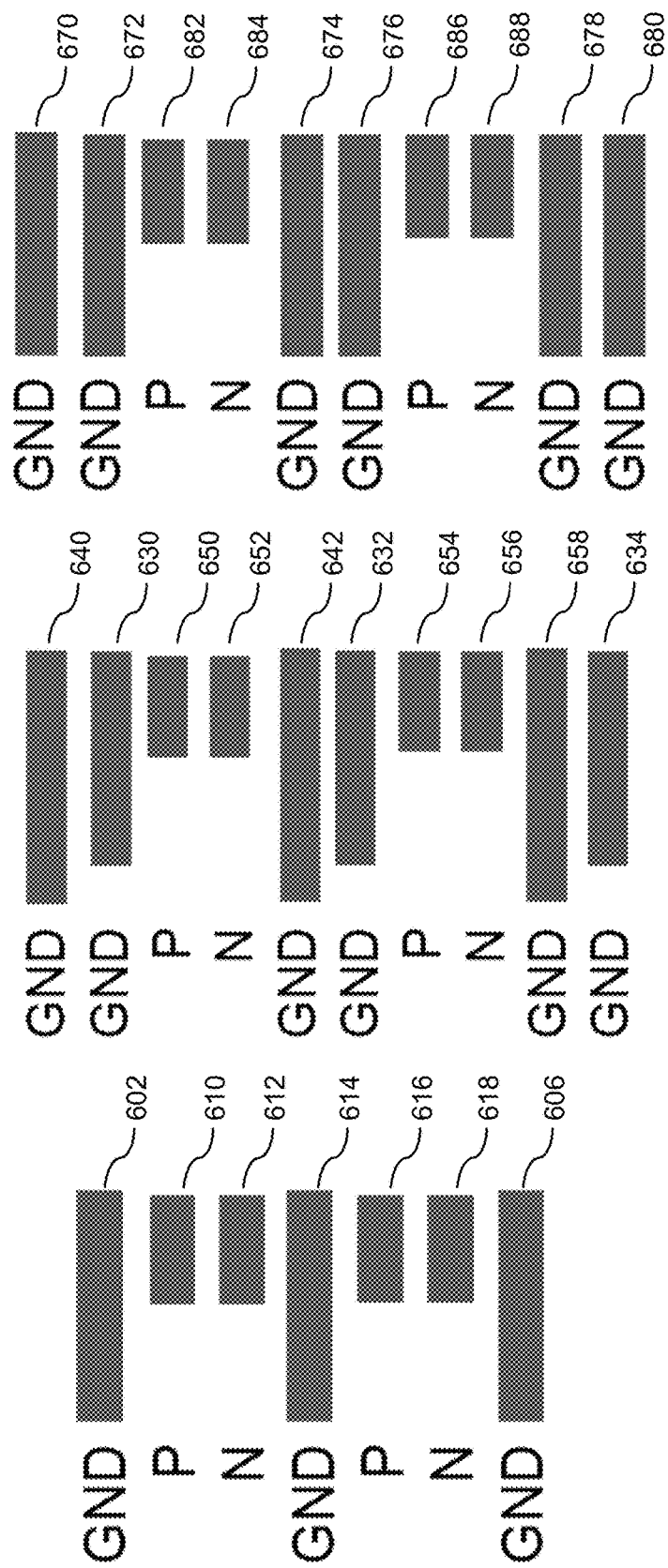

SURFACE MOUNT PADS FOR NEXT GENERATION SPEEDS

BACKGROUND

The present disclosure relates generally to high-speed surface mount technology (SMT) connections such as SMT connectors and cables. More particularly, the present disclosure relates to improving signal integrity circuits using such SMT connections.

Many high-speed connectors take advantage of the form factor of SMT connectors, which are known to improve signal integrity when compared with other, bulkier designs. SMT cables are also becoming increasingly popular as they avoid the need for connectors altogether to avoid paddle board and connector impairments. Despite their advantages, both SMT connectors and SMT cables have a number of drawbacks. For example, depending on the direction signal traces break out from SMT components on a board, pads or lead frames of the SMT connector or cable may leave exposed an unused conductive region on the board that oftentimes causes undesired parasitic effects that greatly degrade signal quality and wipe out much of the gains archived by using SMT connections in the first place. Accordingly, it is highly desirable to find new ways to mitigate or eliminate such undesired effects without negatively impacting signal integrity.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments.

FIG. 6A-6C depict simplified schematics illustrating circuit components comprising exemplary ground strips and stubs according to embodiments of the present disclosure.

DETAILED DESCRIPTION OF THE PREFERRED EMBODIMENTS

Figure 1:
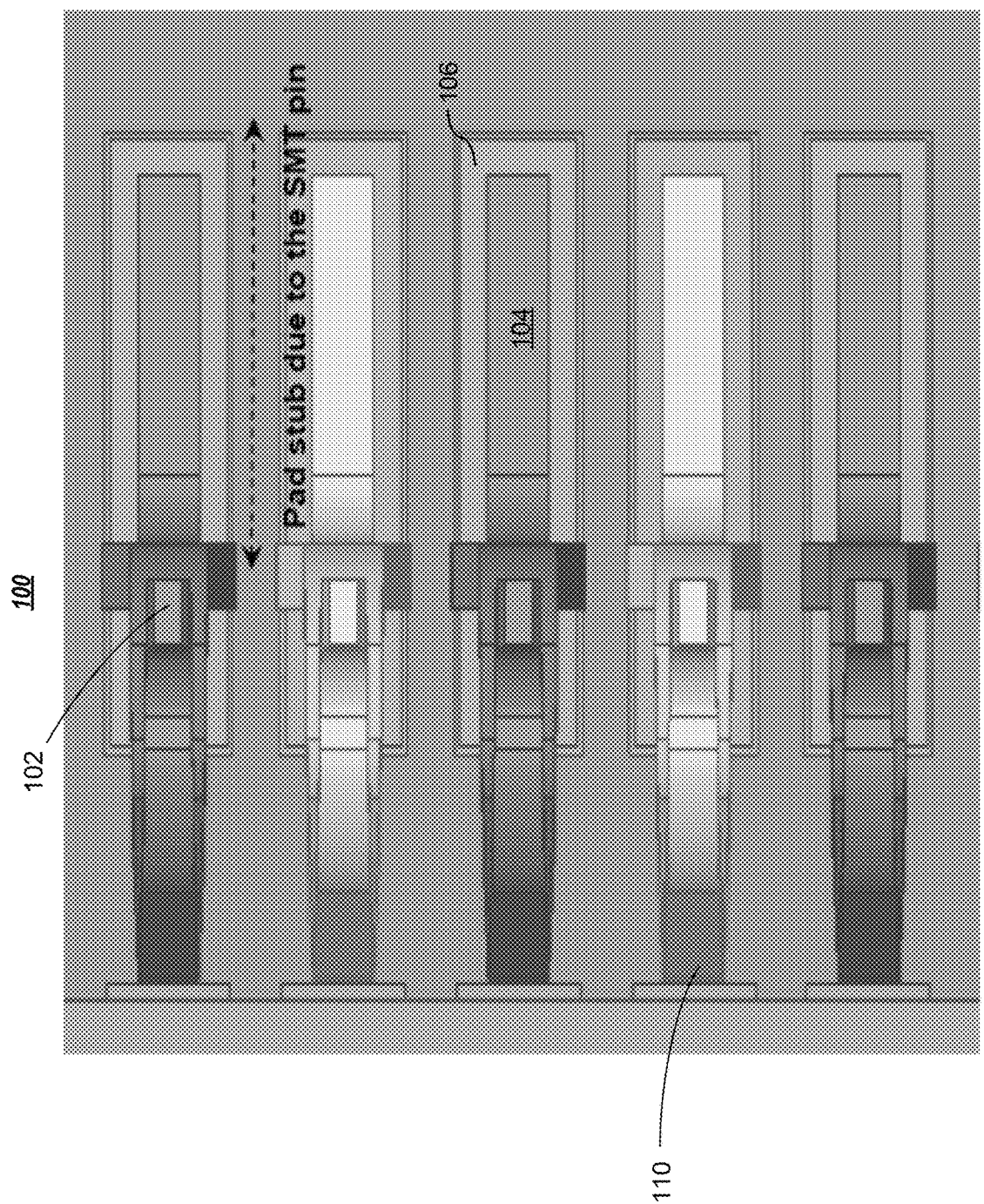
FIG. 1 ("FIG. 1") is a top view of a common SMT connector circuit layout having an unused pad portion that forms a resonant stub.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledge, message, query, etc., may comprise the exchange of one or more messages.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items. The words "optimal," "optimize," "optimization," and the like refer to an improvement of an outcome or a process and do not require that the specified outcome or process has achieved an "optimal" or peak state.

It shall be noted that any experiments and results provided herein are provided by way of illustration and were performed under specific conditions using a specific embodiment or embodiments; accordingly, neither these experiments nor their results shall be used to limit the scope of the disclosure of the current patent document.

It shall also be noted that although embodiments herein may be described within the context of SMT connectors, aspects of the present disclosure are not so limited. As a person of skill in the art will appreciate that the teachings described herein may improve signal integrity in other circuits that exhibit similar or different transmission line effects. For example, discrete circuit components, such as capacitors and inductors soldered on a PCB trace or cables that could form a stub at certain frequencies may benefit from using the teachings described herein. Accordingly, the aspects of the present disclosure may be applied or adapted for use in many other contexts.

Ever-increasing demands on bandwidth and thus transmission speeds for digital signal processing require higher and higher operating frequencies, i.e., high-speed signals that have shorter and shorter wavelengths and signals with picosecond rise times. As is known in the art, once the geometrical dimensions of conductors and other conductive structures shrink to levels that are comparable to the electrical wavelengths of the signals transmitted by such conductors, this gives rise to transmission line effects. Oftentimes, these effects change the electrical transmission characteristics of a communication channel in a manner that result in unwanted signal distortion, increased insertion loss (single-ended or differential), and other non-linearities that adversely affect signal integrity.

For example, once the length of a via—a plated through-hole representing a branch of a tee junction in a signal path—in an integrated circuit is at or about a quarter-wavelength of the high-frequency electrical signal in the signal path, the via behaves like an open circuit transmission line, even if the via itself has not been designed to carry any high-frequency signals.

To ameliorate adverse transmission line effects of vias on signal integrity and improve insertion loss, common design considerations involve shielding of ground vias, choice of desired signal and ground via assignments, and mechanical back drilling that removes (i.e., drills out) conductive material (e.g., copper) from unused portions of the via, which may then be filled with a dielectric material, such as an electrically non-conductive epoxy. Such added, costly manufacturing steps introduce their own mechanical and electrical drawbacks, e.g., differing thermal expansion coefficients of the epoxy and the plated via, and the like.

FIG. 1 is a top view of a common SMT connector circuit layout having an unused pad portion that forms a resonant stub that may cause unwanted resonance effects. Circuit 100 circuit may be used, for example, for 28 GB/sec non-return-to-zero (NRZ) signaling and comprises a lead frame that includes connector pin 102 and pin leg 104. Circuit 100 further comprises connector pad 106, and a signal path 110 that includes connector pin 102. Circuit components 102-106 may be formed from electrically conductive material, e.g., copper that is mounted on a non-conductive PCB material, such as FR4 dielectric that is not shown in FIG. 1. Also not shown in FIG. 1 are conductive ground strips that may serve as return paths for electrical signals.

As depicted in FIG. 1, both pin leg 104 and the area of connector pad 106, which extends to the left-hand-side of connector pin 102 in FIG. 1, are not considered part of signal path 110. In other words, pin leg 104 and most of connector pad 106 in FIG. 1 are "unused" portions of SMT circuit 100.

Figure 2:
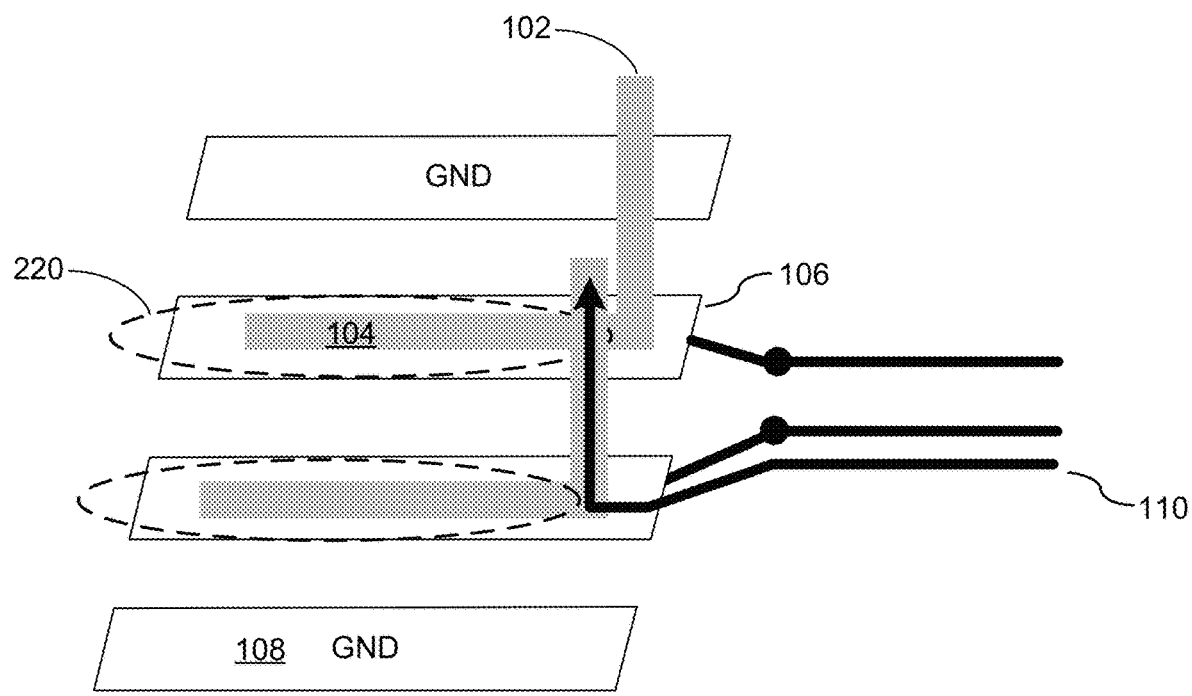
FIG. 2 is a simplified schematic illustration of the circuit in FIG. 1.

These unused portions, regions, or areas are indicated by dashed lines in FIG. 2, which is a simplified schematic illustration of the circuit in FIG. 1. Components similar to FIG. 1 are labeled in a similar manner. At high operating frequencies, e.g., in the GHz rage or in the presence of high-speed signals that, depending on data rates, have relatively short rise times in the picosecond range, these unused portions 220 of SMT circuit 200 are subject to transmission line effects (also known by their misnomer "standing wave" effects) once their electrical lengths become comparable to their physical sizes. Unused portion 220 of SMT circuit 200 generates undesired resonances, antenna effects and, under certain circumstances, behaves like an open-ended transmission line, i.e., an unterminated resonant stub that acts a notch filter.

In practice, these effects (hereinafter collectively "pad resonance") depend mainly on the length of the electrically conductive stub and, more generally, on geometry, i.e., electrical inductance and capacitance, which that are purely functions of geometry, that determine the presence and locations of resonance frequencies associated with SMT circuit 200. As a rule of thumb, the greater the length or physical dimension of the unused portions is, i.e., the larger the coupling area, the greater the capacitive coupling to signal path 110 and the more adverse effects pad resonance has on crosstalk and thus on signal integrity.

Accordingly, it would be desirable to have efficient cost-effective systems and methods in place that reduce unwanted transmission line effects in SMT connections and provide excellent electrical performance for next generation speeds without compromising mechanical stability.

Figure 3:
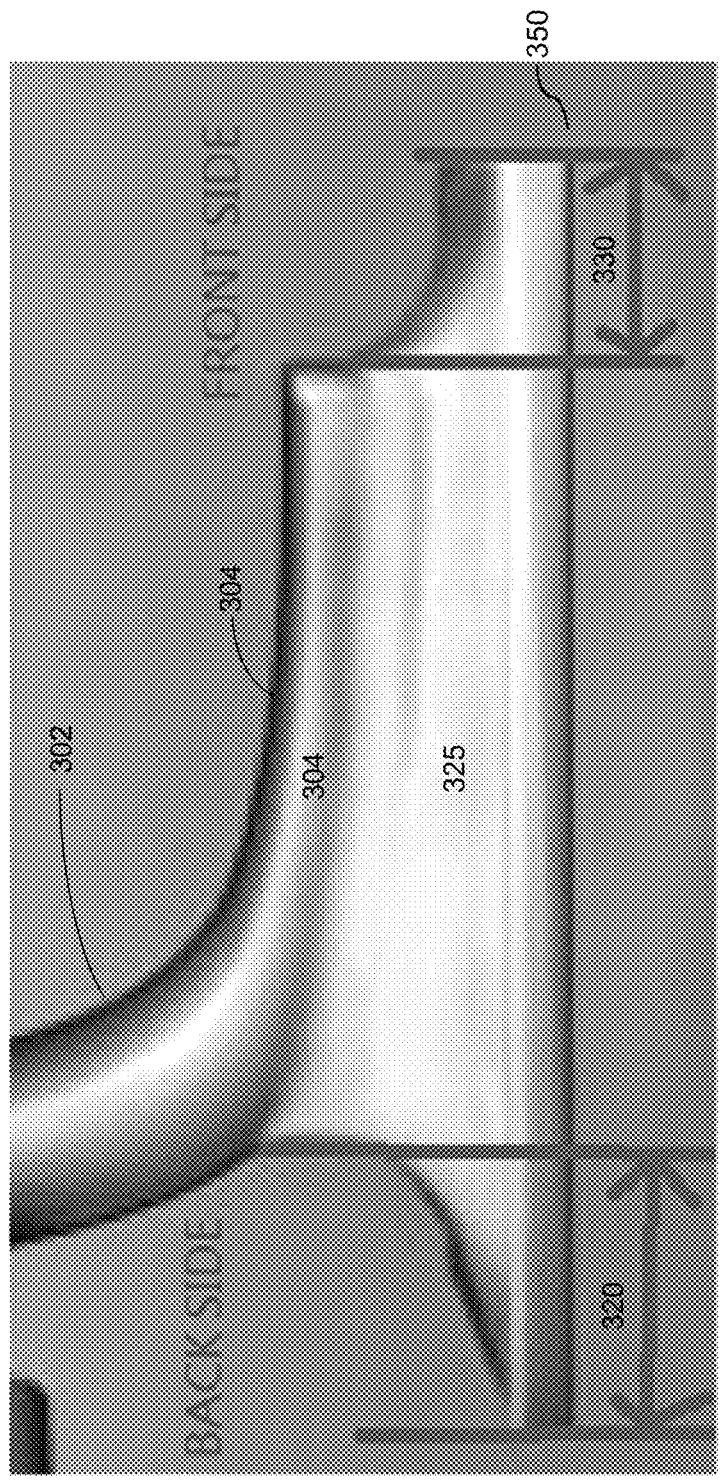
FIG. 3 shows the mating location of a lead frame that is soldered onto a pad.

FIG. 3 shows the mating location of a lead frame that is soldered onto a pad. As depicted in FIG. 3, pin 302, which is part of the lead frame, has a pin leg 304 that is bent such as to be substantially parallel to mating surface 350 and mate with metal surface 350, via wetting areas 320-330 at the front side 330, middle 325, and back side 320 of connector leg 304, respectively.

Manufacturing tolerances, variations in wetting areas 320-330, alignment variations, and other considerations, such as ensuring that pin leg 304 is properly placed on the metal surface 350 of the pad, usually require the dimension(s) of the pad on which connector pin leg 304 rests to extend beyond the dimension of pin leg 304. In addition, connector pin leg 304 is not always mounted at the same location on the PCB pad on different boards.

Figure 5A:
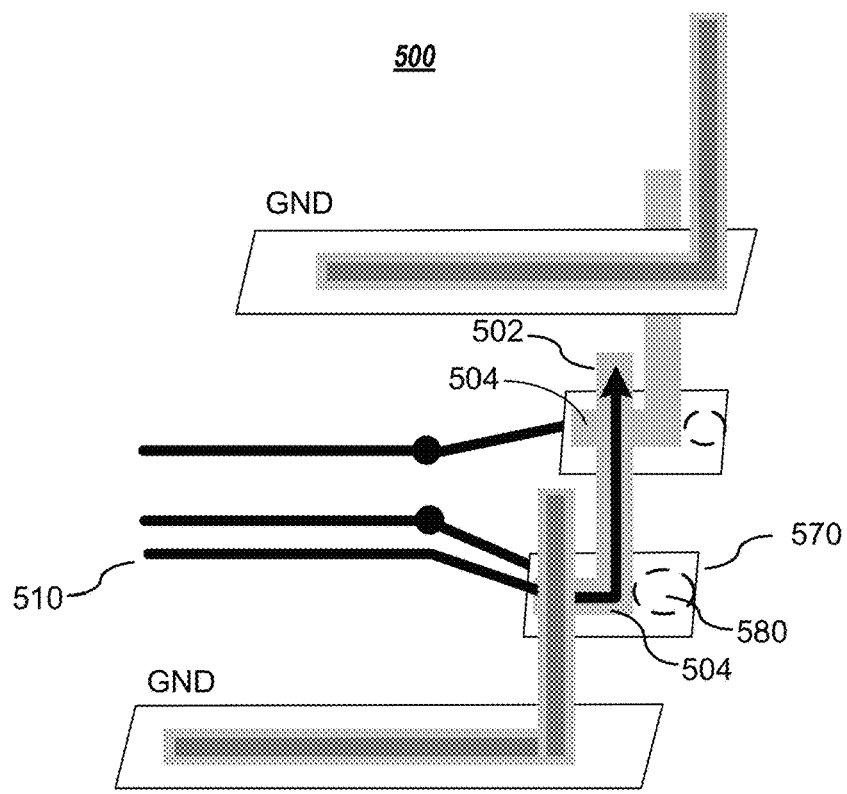
FIG. 5A depicts a PCB design having a signal breakout according to embodiments of the present disclosure.
Figure 5B:
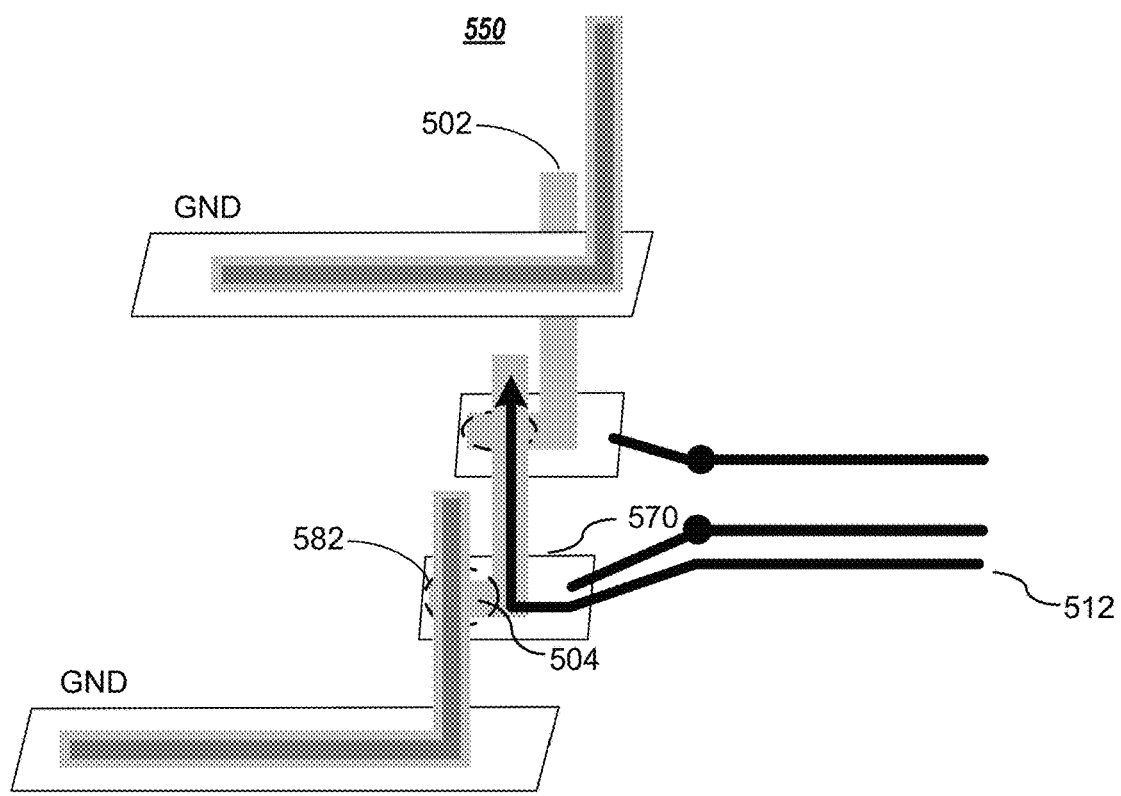
FIG. 5B depicts a PCB design having an alternate signal breakout pattern, according to embodiments of the present disclosure.

As a person of skill in the art will understand that, just like the unused portions of pad area in, e.g., FIG. 2, FIG. 5A, and FIG. 5B, the wetting areas at the front side 320 and/or back side 330 of leg 304 contribute to the pad resonance. In addition, as can be easily gleaned from FIG. 2, FIG. 5A, and FIG. 5B, the unused portions can exacerbate pad resonance and other transmission line effects when the signal breakout is sub-optimal.

Figure 4A:
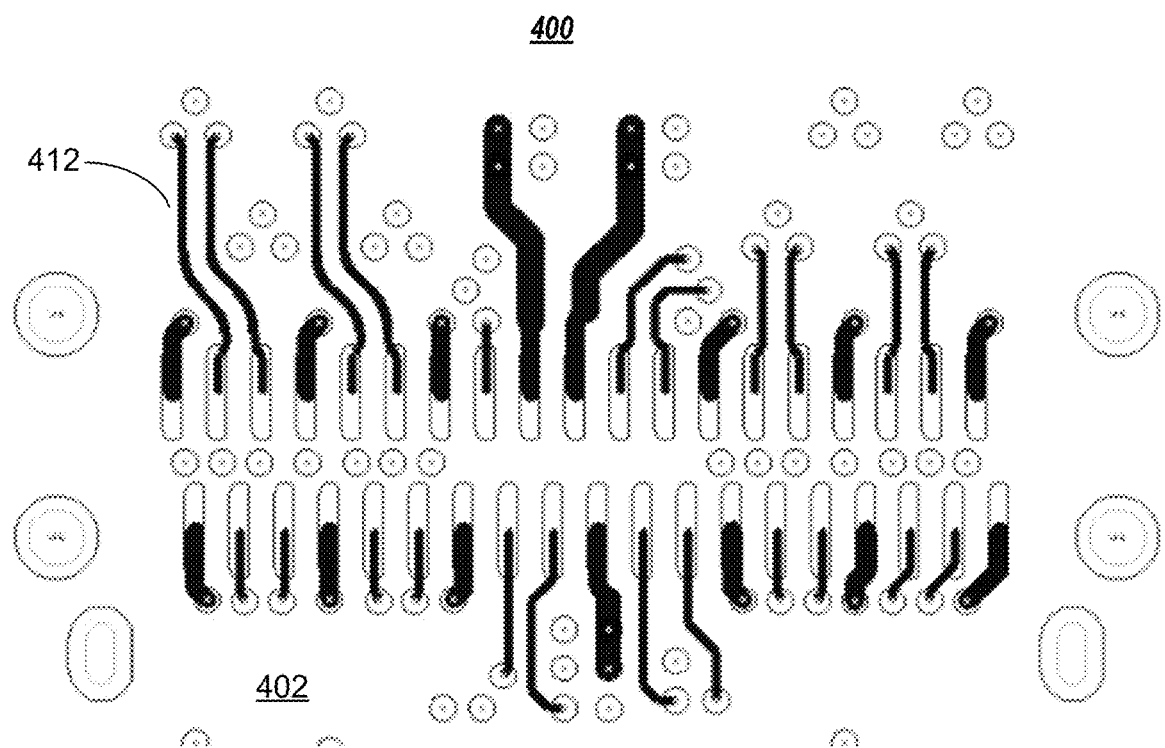
FIG. 4A depicts trace breakouts in one direction of a printed circuit board (PCB), according to embodiments of the present disclosure.
Figure 4B:
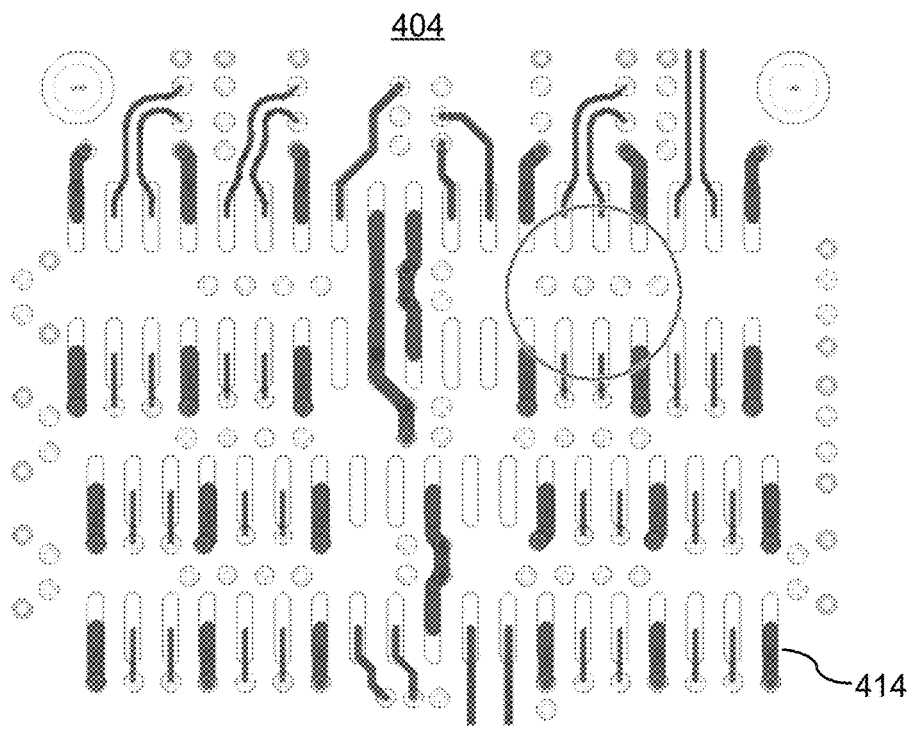
FIG. 4B depicts trace breakouts in two directions of a PCB, according to embodiments of the present disclosure.

FIG. 4A depicts traces that break out in one direction of a PCB, according to embodiments of the present disclosure. Board 402 comprises traces 412, e.g., a number of differential transmit and/or receive paths in a connector port. As shown, traces 412 are restricted to breaking out only at the top of board 402, which is typically a desired approach. In practice, however, circuit designs that use Quad Small Form-Factor Pluggable Double Density (QSFPDD), QSFP, and SFP connectors are notorious for having pad stubs where, depending on the layout engineer, the traces may breakout on any side of the pad. FIG. 4B depicts trace breakouts 414 in both directions of PCB 404, which, in embodiments, may provide routing relief. It is understood that any number of breakout options may be implemented for a given circuit, e.g., to satisfy certain footprint requirements, accommodate vendor requirements, and the like.

FIG. 5A depicts a PCB design having a signal breakout according to embodiments of the present disclosure. As shown, the signal breakout in circuit 500 leads to pin leg 504 and the area of that metal pad 570 on the left-hand-side of connector pin 502 being utilized as part of signal path 510. As previously mentioned, unused portion 580 of circuit 500 may create unwanted resonance effects that may cause, e.g., insertion loss.

In embodiments, by making pin leg 504 and most of pad 570 contribute to signal path 510, this approach advantageously reduces the dimensions of the potential resonant structure (formed by pin leg 504 and most of pad 570) to unused portion 580, i.e., the area of metal pad 570 that is located to the right-hand-side of connector pin 502.

In embodiments, unused portion 580 may be designed to be sufficiently short, e.g., in one or more physical dimensions, such as to cause one or more resonance frequencies of the resonant structure that may be created by virtue of the presence of unused portion 580 to exceed the frequency of interest of an electrical signal in signal path 510. For example, in embodiments, by shortening unused portion 580, the pad resonance frequency may be shifted toward higher frequencies relatively far away from the frequency of interest. Shifting pad resonances in this manner is not only cost-effective but it also causes unused portion 580 to less likely interfere with the electrical signal in signal path 510, thereby, improving the integrity of the electrical signal, which, advantageously, goes hand-in-hand with decreasing return loss, crosstalk, and overall end-to-end losses.

FIG. 5B depicts a PCB design having an alternate signal breakout pattern, according to embodiments of the present disclosure. As shown, the signal breakout in circuit 550 leaves exposed portions of metal pad 570 and pin leg 504 that are not intended to be part of signal path 512. In other words, these portions constitute unused portion 582. Similar to the unused portion in FIG. 5A, unused portion 582 in FIG. 5B may create unwanted resonance effects in operation that may result, e.g., in the insertion loss exceeding a desirable threshold.

Therefore, in embodiments, as with the unused portion in FIG. 5A, unused portion 582 in FIG. 5B may be designed relatively short, e.g., electrically and mechanically short, such that its pad resonance is shifted to a frequency region that is less likely to interfere with electrical signals, e.g., distort waveforms, in signal path 512, again, improving signal integrity. In embodiments, a potential loss in rigidity caused by decreasing one or more pad dimensions by shortening one or more stubs may be compensated by increasing the length of one or more ground strips to increase or maintain overall mechanical stability, as illustrated in FIG. 6A-FIG. 6C.

FIG. 6A-6C depict simplified schematics illustrating circuit components comprising exemplary ground strips and stubs according to embodiments of the present disclosure. FIG. 6A comprises ground strips 602-606 and stubs 610-618. As shown, one or more stubs 610-618 are designed to be electrically and mechanically shorter than one or more of ground strips 602-606, such that ground strips 602-606 and stubs 610-618 may have different length, e.g., to accommodate different connections.

In embodiments, to increase mechanical stability that may have been reduced by, e.g., shortening stubs 610-618, the length of ground strips 602-606 may be increased to enhance overall rigidity and mechanical stability. For example, ground strips 630-634 shown in FIG. 6B are designed to be longer than ground strips 640-644 to compensate for relatively short stubs 650-658.

In embodiments, as shown in FIG. 6C, a potential loss in rigidity stubs in 682-688 may be compensated by increasing the number of ground strips 670-680, again, to increase or maintain overall mechanical stability. Advantageously, the benefits of reducing or eliminating unwanted transmission line effects, including resonances, according to various embodiments of the present disclosure may be accomplished independent of the direction(s) signals break out.

In addition to varying the dimensions of ground strips 602-606 and stubs 610-618, in embodiments, the lengths of traces or other physical structures in a circuit or SMT connector that carry lower-speed signals, such as power and ground lines may be increased to ensure mechanical reliability. As a person of skill in the art will appreciate, these traces and the low-speed signals that they carry are, advantageously, much less susceptible to unwanted transmission line effects.

It is noted that items in the figures herein are not drawn to scale. It is further noted that while various circuit components may be implemented as planar microstrip designs, this is not intended as a limitation on the scope of the present disclosure. The teachings herein may equally apply to other designs, including free-standing electrical components, e.g., at lower frequencies than those discussed herein.

Figure 7:
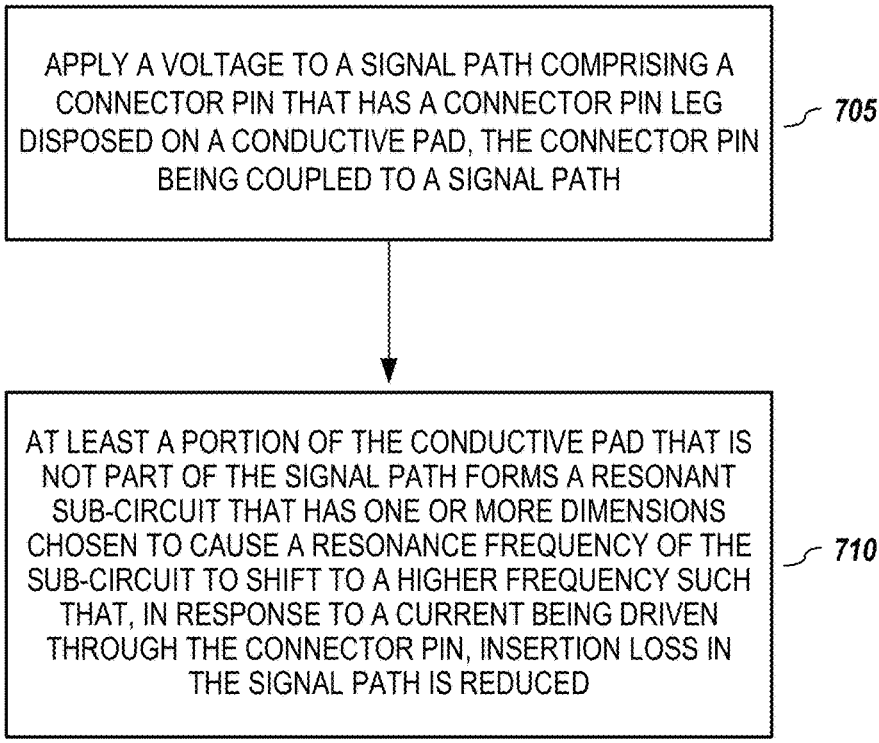
FIG. 7 is a flowchart illustrating a process for improving signal integrity, according to embodiments of the present disclosure.

FIG. 7 is a flowchart illustrating a process for improving signal integrity, according to embodiments of the present disclosure. In embodiments, process (700) for improving signal integrity may begin by applying (705) a voltage to a signal path that comprises a connector pin, such as the connector pin in one embodiment illustrated in FIG. 2. The voltage drives a current through the connector pin, which may be coupled to a connector pin leg that is disposed on a conductive pad. The connector pin leg and at least a portion of the pad that is not part of the signal path may form a resonant sub-circuit, e.g., together with a ground connection that may be capacitively coupled to at least the connector pin leg. The resonant circuit may cause transmission line effects at one or more frequencies and may cause a signal to be reflected into the signal path due to an impedance discontinuity that may result from the signal path having a different impedance than the resonant circuit.

In embodiments, the sub-circuit has one or more dimensions that are chosen in a manner that cause a resonance frequency of the sub-circuit to shift (710) to a higher frequency. As a result, once current is driven through the connector pin, insertion loss in the signal path is reduced. In embodiments, one or more physical dimensions of the sub-circuit may be chosen to be significantly smaller than the electric length of a wavelength of a signal in the signal path. Advantageously, this reduces one or more transmission line effects by removing unwanted resonance from a frequency or frequency band of interest associated with the signal in the signal path. In embodiments, one or more physical dimensions of the sub-circuit may be adjusted to more closely match an impedance of the signal path having to the impedance of the resonant sub-circuit, thereby, causing less of the signal to be reflected into the signal path, further, reducing insertion loss.

It shall be noted that: (1) certain steps may optionally be performed; (2) steps may not be limited to the specific order set forth herein; (3) certain steps may be performed in different orders; and (4) certain steps may be done concurrently.

One skilled in the art will recognize no computing system or programming language is critical to the practice of the present disclosure. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A high-speed transmission circuit comprising: a first connector pin that serves as part of a signal path for a high-speed signal, the first connector pin coupled to a first signal trace that extends toward a first end of a printed circuit board (PCB); a pad coupled to the first connector pin, the pad comprising a first pad region that is not considered part of the signal path; a connector pin leg coupled to the first connector pin, the connector pin leg being disposed on the pad; a resonant sub-circuit formed at least by the first pad region, the resonant sub-circuit comprising one or more dimensions chosen to more closely match an impedance of the signal path to the impedance of the resonant sub-circuit such as to reduce an insertion loss in the signal path, which comprises the first signal trace, the first pad region extending from the first connector pin towards a second end of the PCB, the second end being opposite to the first end; and a second connector pin coupled to a second signal trace and to a second pad region that extend from the second connector pin toward a second end of the PCB.

2. The high-speed transmission circuit of claim 1, further comprising a low-speed structure having least one dimension that is greater than the one or more dimensions of the resonant sub-circuit to increase mechanical stability or to compensate for a potential loss in mechanical stability.

3. The high-speed transmission circuit of claim 2, wherein the low-speed structure is designed to assume a ground potential.

4. The high-speed transmission circuit of claim 1, wherein the first connector pin is associated with a first impedance at a frequency of operation, and wherein the connector pin leg is associated with a second impedance at the frequency of operation.

5. The high-speed transmission circuit of claim 4, wherein the second impedance represents an impedance discontinuity at the frequency of operation.

6. The high-speed transmission circuit of claim 5, wherein the impedance discontinuity causes a signal at the frequency of operation to be reflected into the signal path.

7. The high-speed transmission circuit of claim 1, wherein the resonant sub-circuit causes a transmission line effect at a resonant frequency.

8. The high-speed transmission circuit of claim 1, wherein the circuit carries a signal having one or more high frequency components that flow on an outer layer of the first connector pin.

9. A lead frame comprising: a first connector pin coupled to a first signal trace that serves as part of a signal path in a circuit; a connector pin leg coupled to the first connector pin and to a first pad that comprises a first pad region that is not considered part of the signal path that extends toward a first end of a printed circuit board (PCB), the connector pin leg and
at least a portion of the first pad forming a resonant sub-circuit that is coupled to the signal path, at least one dimension of the portion of the resonant sub-circuit being chosen to more closely match an impedance of the signal path to the impedance of the resonant sub-circuit such as to cause a reduction in insertion loss in the signal path, which comprises the first signal trace, the first pad region extending from the first connector pin toward a second end of the PCB, the second end being opposite to the first end; and a second connector pin coupled to a second signal trace and to a second pad region that extend from the second connector pin toward a second end of the PCB.

10. The lead frame of claim 9, wherein a reduction in mechanical stability that is caused by the at least one dimension is compensated by increasing at least one dimension of a physical structure in the circuit.

11. The lead frame of claim 10, wherein the physical structure is designed to carry signals that have relatively lower speeds or rise times than the resonant sub-circuit.

12. The lead frame of claim 9, wherein the first connector pin is associated with a first impedance at a frequency of operation, and wherein the connector pin leg is associated with a second impedance at the frequency of operation.

13. The lead frame of claim 12, wherein the second impedance represents an impedance discontinuity at the frequency of operation.

14. The lead frame of claim 13, wherein the impedance discontinuity causes a signal at the frequency of operation to be reflected into the signal path.

15. The lead frame of claim 9, wherein a current that flows on an outer layer of the first connector pin has one or more high frequency components.

16. A printed circuit board (PCB) comprising:
a first connector pin coupled to a first signal trace that extends toward a first end of the PCB;
a pad coupled to the first connector pin, the pad comprising a first pad region that has one or more dimensions chosen to at least partially match an impedance of a first signal path such as to reduce an insertion loss in the first signal path, which comprises the first signal trace, the first pad region extending from the first connector pin toward a second end of the PCB, the second end being opposite to the first end; and
a second connector pin coupled to a second signal trace and to a second pad region that extend from the second connector pin toward the second end of the PCB.

17. The PCB of claim 16, further comprising a first connector pin leg that is coupled to the first connector pin and is disposed on the pad.

18. The PCB of claim 17, wherein at least one of the one or more dimensions of the first pad region is smaller than a largest dimension of the first connector pin leg.

19. The PCB of claim 17, further comprising a second connector pin leg that is coupled to the second connector pin and is disposed on a second pad region that has one or more dimensions chosen to at least partially match an impedance of a second signal path that comprises the second signal trace.

* * * * *